United States Patent [19]
Kanehara

[11] Patent Number: 6,023,613
[45] Date of Patent: Feb. 8, 2000

[54] SYNTHESIZER RECEIVER FOR AUTOMATICALLY TUNING MASTER STATIONS AND ASSOCIATED SATELLITE STATIONS IN SPECIFIED GEOGRAPHICAL AREAS

[75] Inventor: Yuka Kanehara, Kanagawa, Japan

[73] Assignee: Sony Corporation, Tokyo, Japan

[21] Appl. No.: 08/974,627

[22] Filed: Nov. 19, 1997

[30] Foreign Application Priority Data

Dec. 10, 1996 [JP] Japan ................................ P08-346786

[51] Int. Cl.⁷ ...................................................... H04B 1/18
[52] U.S. Cl. ...................................... 455/165.1; 455/180.3; 455/183.1
[58] Field of Search ............................. 455/165.1, 180.3, 455/183.1, 154.2, 158.4, 185.1

[56] References Cited

U.S. PATENT DOCUMENTS

| | | | |
|---|---|---|---|
| 5,257,294 | 10/1993 | Pinto et al. ........................... | 455/183.1 |
| 5,537,674 | 7/1996 | Kishimoto et al. ................... | 455/161.1 |
| 5,628,061 | 5/1997 | Shirakawa ............................. | 455/185.1 |
| 5,710,994 | 1/1998 | Shiota ................................... | 455/183.1 |
| 5,757,860 | 5/1998 | Shiota ................................... | 455/183.1 |

Primary Examiner—Edward F. Urban
Assistant Examiner—Thuan T. Nguyen
Attorney, Agent, or Firm—Jay H. Maioli

[57] ABSTRACT

A synthesizer receiver automatically tunes to master stations and associated satellite stations in specified geographical areas by utilizing a data table having the master station data corresponding to a plurality of master frequencies associated with broadcasting stations that are received in each of the plurality of divided geographical areas and also containing satellite data corresponding to one or more satellite frequencies individually associated with each one of the plurality of master stations in the divided geographical areas when such a master station does, in fact, have satellite stations associated with it. When one of the data areas containing the master station and satellite station data for the specified geographical areas is selected, the data is read out and used to control a phase-locked loop of the synthesizer receiver to tune to that station. If the master station is not available, the satellite station can be selected.

3 Claims, 6 Drawing Sheets

FIG. 4

| AREA NAME TIME1 | NAME OF BROADCASTING STATION KYOKU | FREQUENCY (KHz) FREQ |
|---|---|---|
| HOKKAIDO | | |
| TOHOKU 1 | | |
| | | |
| KANTO 1 | FM TOKYO | 80.0  76.7  84.3 |
| | BROADCASTING UNIVERSITY | 78.8  77.1 |
| | FM SOUND CHIBA | 78.0  77.7  79.7  87.4 |
| | FM SAITAMA | 79.5  - |
| | FM YOKOHAMA | 84.7  80.4 |
| | FM JAPAN | 81.3 |
| | NHK FM | 82.5  80.7  81.9  83.5<br>83.7  83.9  85.1 |
| | | |
| KYUSYU 2 | | |

DTBL DATA TABLE

FIG. 5

| AREA | A1 | A2 | A3 | ... | A7 |
|---|---|---|---|---|---|
| NAME OF BROADCASTING STATION KYOKU | | | | | |
| FREQUENCY FREQ | | | | | |

34

SYNTHESIZER RECEIVER FOR AUTOMATICALLY TUNING MASTER STATIONS AND ASSOCIATED SATELLITE STATIONS IN SPECIFIED GEOGRAPHICAL AREAS

BACKGROUND OF THE INVENTION

1. Field of the Invention

This invention relates to a synthesizer receiver having a function of pre-setting a signal.

2. Description of the Prior Art

In general, a receiver of a synthesizer system using a PLL can pre-set a broadcasting station using a tuning key, wherein as the tuning key is depressed, a broadcasting electric wave of a broadcasting station pre-set to the depressed key can be selected in one finger touch.

In this case, the pre-setting operation is carried out such that a data of received frequency, for example, a divided frequency ratio of a variable frequency dividing circuit of PLL is written into an address of a memory corresponding to the tuning key. In addition, the tuning operation is realized by reading out a divided frequency ratio from an address corresponding to the depressed tuning key and setting it to the variable frequency dividing circuit. Additionally, the number of tuning keys is about 5 to 9 in general.

Then, as a method for writing the frequency dividing ratio into a pre-setting memory, there is provided a method called as "an area call". This method is carried out such that an entire domestic area of Japan is divided into several areas, for example, the specified area is selected and data of frequency capable of being received in the specified area is read out of a data base in ROM and written into the pre-setting memory.

Accordingly, in accordance with this area call, everybody can easily perform a pre-setting operation.

In view of the foregoing, several number of broadcasting stations improve reception by preparing separately a relay station called a satellite station in a region with bad reception such as a mountain area or the like, broadcasting the same content as that of a proper station (a broadcasting station becoming a master broadcasting station) through the satellite station with a different frequency. Accordingly, almost all the broadcasting stations, i.e. NHK (Nippon Hosoh Kyokai—Japanese Broadcasting Association) or local civil broadcasting stations have several of their own satellite stations.

Due to this fact, if the satellite station can be pre-set to the tuning key, the number of tuning keys is increased. In addition, some of the broadcasting stations not capable of receiving broadcasted program are pre-set in a certain region. However, if the satellite station is not pre-set to the tuning key, it becomes quite natural that the tuning needs to be manually carried out.

This invention aims at solving such problems as described above. In the specification of the present invention, it is assumed that as the satellite station, there is also included a broadcasting station for modifying a part of the program such as a weather forecast or the like in response to an area to be broadcasted other than a relay station for transmitting the content of broadcasted program transmitted from the master broadcasting station.

SUMMARY OF THE INVENTION

In view of the foregoing, the present invention provides a synthesizer receiver in which a signal formed in PLL is used to change a frequency of a received signal, a frequency dividing ratio of the aforesaid variable frequency dividing circuit of PLL is changed to modify a frequency of the aforesaid signal and to change a received frequency, wherein there are provided;

a plurality of tuning keys;

a data table;

a memory having a data area corresponding to each of the aforesaid plurality of tuning keys;

the aforesaid data table having;

a data of frequency of a broadcasting station capable of being received at a divided area for each of the divided areas when the area used in the receiver is divided into a plurality of areas; and data of frequency of the satellite station belonging to that broadcasting station;

when one of the aforesaid divided areas is specified to perform a key operation for a pre-setting, data of frequency of the aforesaid broadcasting station prepared in the specified divided area is written into the data area in the aforesaid memory;

when one of data areas in the aforesaid memory is specified and key operation for changing data is performed, data of frequency of the satellite station of the broadcasting station corresponding to data of frequency written into the specified data area is read out of the aforesaid data table and written into the aforesaid specified data area;

when one of the aforesaid plurality of tuning keys is operated, data of frequency written into the data area is read out of the data area corresponding to the aforesaid operated tuning key of the aforesaid data areas in the aforesaid memory; and a frequency dividing ratio of the aforesaid variable frequency dividing circuit is changed in response to the read-out data of frequency so as to perform a tuning.

Accordingly, the broadcasting station pre-set in the tuning key is changed over from the master station to the satellite station by performing a simple key operation.

BRIEF DESCRIPTION OF THE DRAWINGS

FIG. 4 is a view for showing one preferred embodiment of a data table.

FIG. 5 is a view for showing one preferred embodiment of a content of the memory.

DESCRIPTION OF THE PREFERRED EMBODIMENTS

The present invention is applied to an FM receiver, wherein it is constructed such that the receiver can receive an FM character multiple broadcasting called DARC (Data Radio Channel) mainly developed by the Institute of Broadcasting Technology of NHK in Japan in recent years.

The FM character multiple broadcasting of this DARC system is a system in which data such as character information or the like are multiplexed to a program of normal audio broadcasting through an FM broadcasting and transmitted.

Figure 1:
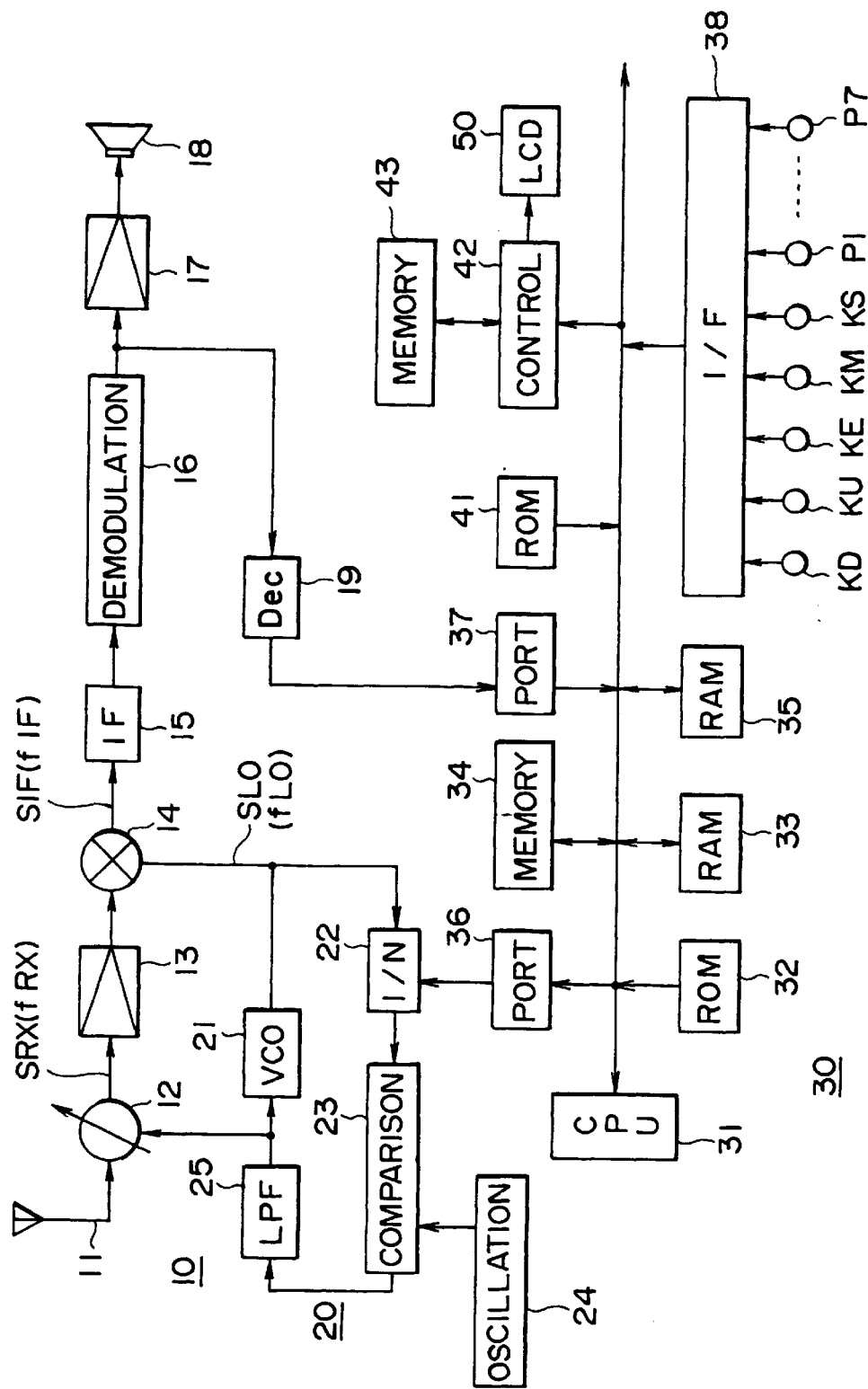
FIG. 1 is a systematic view for showing one preferred embodiment of the present invention.

FIG. 1 is a circuit block diagram for showing the receiver for this FM character multiple broadcasting, wherein reference numeral 10 denotes an FM receiver circuit constructed like a synthesizer system, a received signal from an antenna 11 is supplied to an antenna tuning circuit 12 of an electronic tuning system and then a broadcasting wave signal SRX of a frequency fRX is taken out.

Then, this signal SRX is supplied to a mixer circuit 14 through a high frequency amplifier 13, an oscillation signal SL0 with a frequency fL0, for example, $$fL0 = fRX - fIF \text{ [kHz]} \tag{1}$$

where, fIF is an intermediate frequency, e.g. fIF=10.7 MHz is taken out of VCO 21, this signal SL0 is supplied to the mixer circuit 14 as a local oscillation signal and the signal SRX is converted in its frequency into an intermediate frequency signal SIF (an intermediate frequency fIF).

Further, this intermediate frequency signal SIF is supplied to an FM demodulation circuit 16 through an intermediate frequency amplifier 15 so as to cause an audio signal to be demodulated and this signal is supplied to a speaker 18 through an amplifier 17.

At this time, VCO 21 constitutes PLL 20 together with circuits 22 to 25. That is, the signal SL0 from the VCO 21 is supplied to a variable frequency dividing circuit 22, its frequency is divided into a frequency of 1/N, this divided frequency signal is supplied to a phase comparing circuit 23 and at the same time an oscillation signal with a reference signal, for example, a frequency of 100 kHz is taken out of the oscillation circuit 24, this oscillation signal is supplied to a comparing circuit 23, its comparing output is supplied to the VCO 21 as its control signal through a low-pass filter 25. In addition, an output voltage of the filter 25 is supplied to the tuning circuit 12 as a tuning voltage.

Accordingly, under a normal state of the device, since a frequency dividing signal obtained from a frequency dividing circuit 22 and an oscillating signal of the oscillation circuit 24 are equal to each other in their frequencies, a frequency fL0 of the oscillation signal SL0 at this time becomes $$fL0 = N \times 0.1 \text{ [MHz]} \tag{2}$$

and from the equations (1) and (2), $$\begin{aligned} fRX &= fL0 + fIF \\ &= N \times 0.1 + 10.7 \text{ [MHz]} \end{aligned} \tag{3}$$

is attained.

Accordingly, if the frequency dividing ratio N is changed from 653 to 793, the local oscillation frequency fL0 is changed in an interval of 100 kHz in 65.3 MHz to 79.3 MHz, so that a received signal frequency fRX is changed by a frequency step of 100 kHz in a frequency band of 76.0 MHz to 90.0 MHz and also in correspondence with a frequency dividing ratio N.

Further, this FM receiver is provided with a control means, i.e. a micro-computer 30 acting as a system control. This micro-computer 30 is comprised of a CPU 31, a ROM 32 for a program, a RAM 33 for a work area, a memory 34 for holding data and a RAM 35 for a receiver buffer for character programs. Then, the memories 32 to 35 are connected to the CPU 31 through a system bus 39.

Figure 2:
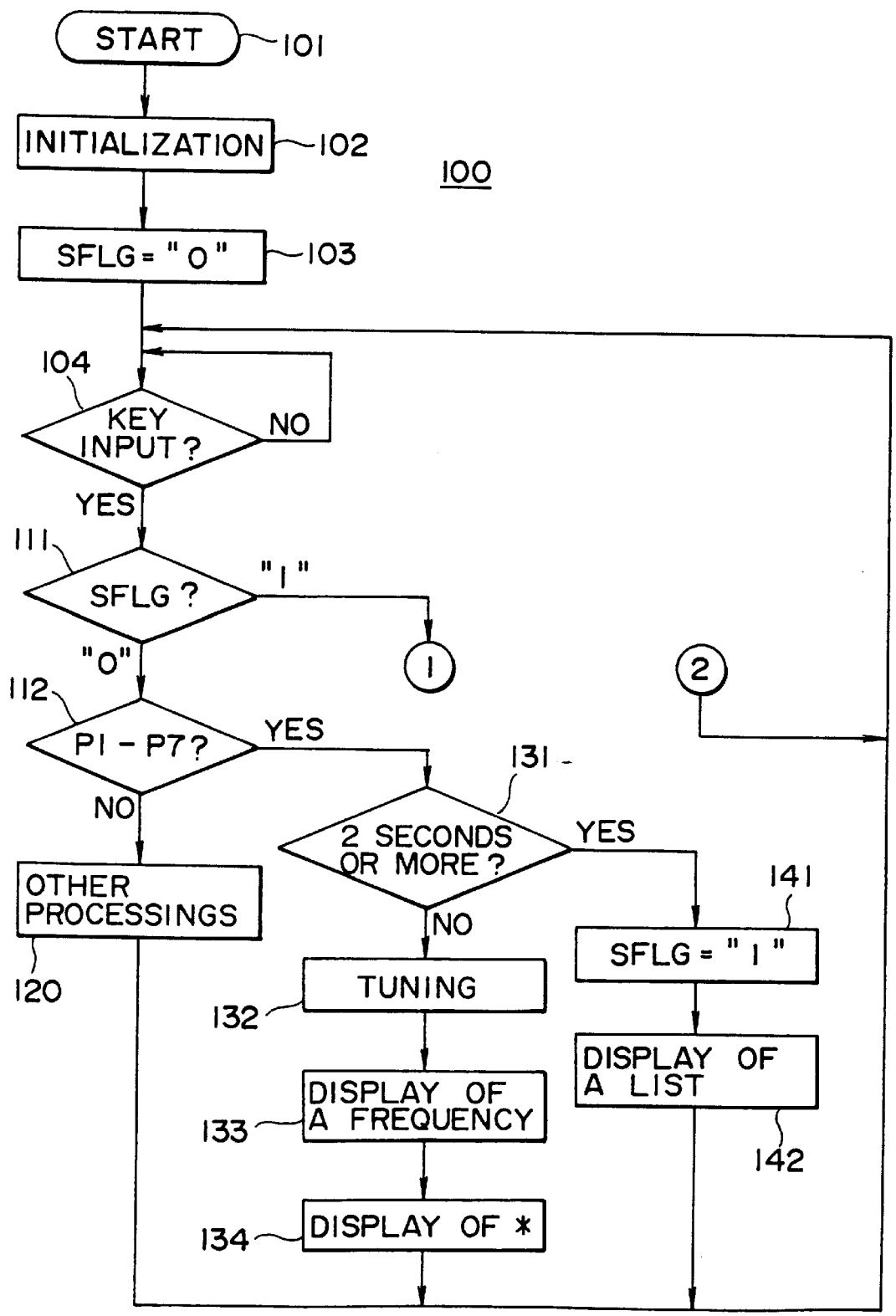
FIG. 2 is a flow chart for showing a part of one preferred embodiment of the present invention.
Figure 3:
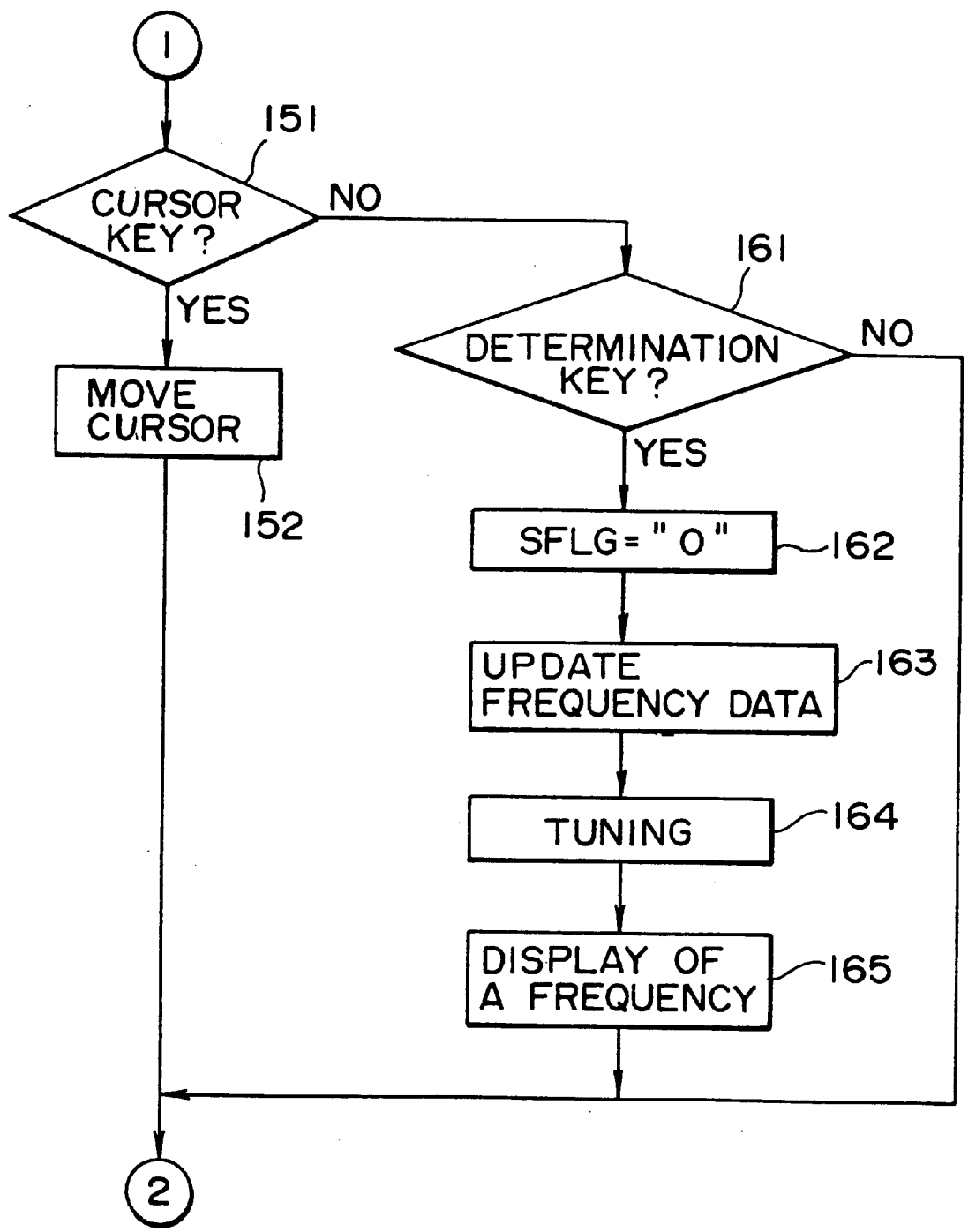
FIG. 3 is a flow chart for showing one preferred embodiment of the present invention which is a continuation of FIG. 2.

In this case, the ROM 32 has a main routine 100 shown in FIGS. 2 and 3, for example. Although a detailed content of this main routine 100 will be described later, the part not related to the present invention is eliminated in FIGS. 2 and 3.

Further, the ROM 32 has a data table DTBL as shown in FIG. 4, for example, as a data base for frequency data for an area call. That is, in the case of the data table DTBL shown in FIG. 4, the entire area of Japan is divided into 14 areas of "Hokkaido", "Tohoku 1" . . . , "Kyusyu 2".

Then, this data table DTBL has a data TIMEI indicating a name of area for every divided area and also has a data KYOKU indicating a name of broadcasting station capable of practically receiving a program at a certain area. Further, this data table DTBL has a data FREQ of a frequency applied for a broadcasting by the broadcasting station (a master station) and a data FREQ for a frequency applied for a broadcasting operation by the satellite station corresponding to the master station. The frequency data FREQ has a master station at its leading end and subsequently a satellite station is set. The satellite stations are arranged in an order from a low frequency to a high frequency.

More practically, although there is a case in which it can not be discriminated what broadcasting station corresponds to the master station and what broadcasting station corresponds to the satellite station, in such a case as above, its representing broadcasting station is selected as the master station and other stations are selected as satellite stations. In addition, the ROM 32 has character data required for various kinds of displays.

Further, the memory 34 is a ROM capable of performing a data deletion and a data writing electrically or a RAM backed up with a battery cell, although not shown, that is, the memory 34 is a non-volatile memory and even if a power supply is turned off, the written data can be held and various kinds of data which are required to be held are accessed even if the power supply is turned off.

Then, this memory 34, as shown in FIG. 5, for example, has data areas A1 to A7 in correspondence with the tuning key to be described later and the data FREQ of the frequency of the broadcasting station preset to the tuning key and the data KYOKU of a name of the broadcasting station can be stored in each of the data areas A1 to A7.

In addition, to the bus 39 are connected ports 36, 37 and an interface circuit 38. Then, a frequency dividing ratio N is set from the CPU 31 to the variable frequency dividing circuit 22 through the port 36 so as to perform a tuning and a receiving signal for the receiver circuit 10. In addition, a demodulated signal from a demodulation circuit 14 is supplied to a decoder circuit 19, data of the character program is decoded, corrected for its error and taken out of LMSK (Level Controlled Minimum Shift Keying) signal, and this data is accumulated in the RAM 35 for the receiving buffer through the port 37.

In addition, to the interface circuit 38 are connected cursor keys (down-key and up-key) KD and KU, a determination key KE, a menu key KM, a set key KS and seven tuning keys P1 to P7. The keys KD, KU, KE, KM, KS, P1 to P7 are comprised of non-lock type push switches.

Further, to the bus 39 is connected a font ROM (a character generator) 41 having font data for converting character data sent by an FM character multiplex broadcasting into display data and at the same time a display controller 42 is connected to it. Then, a displaying memory 43 is connected to the controller 42 and an LCD 50 acting as a display element is connected to it.

Figure 6:
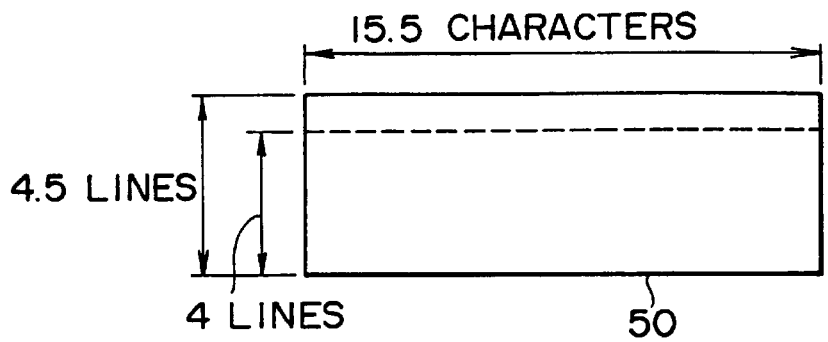
FIG. 6 is a view for showing one preferred embodiment of a part of the present invention.

In this case, the LCD 50 is an element for displaying characters or the like under a proper combination of dots, and this has a size of 15.5 characters×4.5 lines (lateral 248 dots×vertical 72 dots) as shown in FIG. 6, for example. Then, an area of the upper-most 0. 5 line (vertical 8 dots) is defined as a header area and an area of the remaining 4 lines (vertical 64 dots) is defined as a main area for displaying a text.

Further, the memory 43 is of a bit-map system in correspondence with a dot displaying system of the LCD 50 and has a capacity of one screen of the LCD 50. Then, either data held at the RAM 35 for a receiving buffer or data prepared in advance in ROM 32 is read out by the CPU 31, the read-out data is converted into displaying data under application of the font data in the ROM 41 and the displaying data is written into the memory 43 through the controller 42.

At this time, the displaying data of the memory 43 is read out in repetition under an operation of the controller 42 and concurrently the data is converted into a displaying signal and supplied to the LCD 50. Accordingly, at the LCD 50 is displayed either a character of character data read out of the RAM 35 by CPU 31 or a character with character data prepared in the ROM 32.

With such an arrangement as above, various kinds of processing such as a displaying operation is carried out as follows under the operation of the CPU 31.

[Up to the key input waiting]

In this paragraph, an operation ranging from a turning-on of the power supply of the receiver to a key input waiting under a normal state of the receiver will be described. That is, when the power supply of the receiver is turned on, the processing at the CPU 31 is started to operate from a step 101 in a routine 100 and subsequently at a step 102, an initialization at each of the sections is executed. For example, a frequency dividing ratio N of a last channel (a receiving frequency received when the power supply is turned off in a previous time) is read out of the memory 34 and set to the variable frequency dividing circuit 22. In addition, the data held in the memory 34 is applied to cause either a name of broadcasting station of the last channel or its frequency to be displayed at the LCD 50. Accordingly, the last channel is received at this time and its audio is outputted from the speaker 18.

Subsequently, the processing is advanced to a step 103 and at this step 103, a satellite flag SFLG is set to "0". When the master station is pre-set to the tuning key, this satellite flag SFLG is "0" and in turn when the satellite station is preset, this satellite flag SFLG becomes "1". Then, subsequently, the processing is advanced to a step 104, and at this step 104, a key input waiting operation is carried out.

In this case, if the character multiplex broadcasting is being performed at the last channel, the data of the character program is decoded, corrected in its error and taken out of the decoder circuit 19 and the data is accumulated in the RAM 35 for the receiving buffer.

Then, under this key input waiting state, if a user performs a key inputting operation, each of the processes is carried out as follows in response to the key input.

[Selection of Character Program]

This operation corresponds to the case in which an optional character program is selected from total contents of the programs displayed at the LCD 50 and displayed. In this case, at first the menu key KM is depressed.

Then, the processing at the CPU 31 is advanced from the step 104 to the step 111 and at this step 111, it is checked whether or not the satellite flag SFLG is "0". In this case, since SFLG="0" is attained due to the step 103, the processing is advanced from the step 111 to the step 112, and at this step 112, it is checked whether or not the key inputted at the step 104 is the tuning keys P1 to P7.

Then, in this case, the key is the menu key KM, so that the processing is advanced from the step 112 to the step 120, wherein at the step 120, the total contents of the character program (main menu) are displayed at the LCD 50 in response to the character data of the RAM 35. Then, when either the down-key KD or the up-key KU is depressed, the cursor moves forward or rearward between the items of the total contents displayed at the LCD 50 in response to the keys KD and KU.

Then, the cursor is moved up to an item to be target of the items of the total contents and when the determination key KE is depressed, that item is selected and the contents at a lower position to that item is displayed at the LCD 50. Subsequently, a similar key operation is carried out, and it is possible to display the character program to be target. In addition, subsequently, the processing at the step 104 becomes a key input waiting state.

[Preset for the Broadcasting Station]

This operation corresponds to the case in which the broadcasting station (a master station) is preset to each of the tuning keys P1 to P7, this pre-set operation is carried out by the area call. Due to this fact, in the case that [the pre-setting of the broadcasting station] is carried out, the set key KS is depressed when the key-input waiting is attained at the step 104.

Then, the processing at the CPU 31 is advanced from the step 104 through a step 111 to the step 120 through a step 112. Then, at this step 120, a menu for setting the operation mode of the receiver is displayed at the LCD 50 in response to the key input at the step 104. Then, as the down key KD and the up key KU are depressed, the cursor is moved between the items of the menu displayed at the LCD 50, resulting in that the cursor is positioned at [Setting of Area] in the menus and as the determination key KE is depressed, the operation mode becomes [Area Setting Mode].

Under this [Area Setting Mode] the area name is displayed at the LCD 50 in reference to the data TIMEI of the area name prepared in the data table DTBL. Then, as the down key KD and the up key KU are depressed, the cursor is moved between the displayed area names, so that the cursor is positioned at the area name including a receiving location of a user in the area names and then the determination key KE is depressed.

For example, if the receiving location is "Tokyo", the cursor is positioned at "Kanto 1" and then the determination key KE is depressed. Then, both data KYOKU of a name of broadcasting station and a frequency data FREQ included in "Kanto 1" are read out of the data table DTBL and written into the areas A1 to A7 of the memory 34. In this case, as per the broadcasting station having data about the master station and the satellite station as the frequency data FREQ, the frequency data FREQ of the master station is written. In addition, the data TIMEI of the name of area at this time is held in the memory 34.

In this way, as the determination key KE is depressed while the cursor is positioned at the area name to be target, data KYOKU of the name of the broadcasting station in the corresponding area and the frequency data FREQ are read out of the data in the data table DTBL and then written into the areas A1 to A7 in the memory 34. In addition, in the case that the data KYOKU of the name of the corresponding station and the frequency data FREQ are not present in numbers corresponding to those of seven stations, certain data of certain broadcasting stations are overlapped and used.

Upon completion of the aforesaid processing, the processing is returned from the step 120 to the step 104 and the key input waiting is set again.

Accordingly, the broadcasting station is pre-set to the tuning keys P1 to P7 through an area call. The broadcasting station pre-set at this time is a master station.

[Tuning of the Pre-set Broadcasting Station]

This operation corresponds to the case in which the broadcasting stations preset in the tuning keys P1 to P7 are selected in accordance with [Pre-setting of the Broadcasting Station]. In this case, when the key input waiting is carried out at the step 104, the preset tuning key Pm (any one of m=1 to 7, similarly applied to the following description) to be target is depressed for a short period of time.

Then, although the processing at the CPU 31 is advanced from the step 104 to the step 112 through the step 111 as described above, in this case, since the tuning key Pm is depressed, the processing is advanced from the step 112 to the step 131 and at the step 131, it is checked subsequently whether or not the tuning key Pm depressed at the step 104 is also being depressed for more than 2 seconds, for example.

Then, in the case of [Tuning of the Pre-set Broadcasting Station], since the tuning key Km is depressed for a short period of time, the processing is advanced from the step 131 to the step 132, and at the step 132, the frequency data FREQ written in the area Am corresponding to the tuning key Pm of the data areas A1 to A7 in the memory 34 is read out, the read-out data FREQ is converted into the frequency dividing ratio N in accordance with the equation (3) and at the same time this frequency dividing ratio N is set in the variable frequency dividing circuit 22.

Accordingly, the frequency indicated by the read-out data FREQ becomes a receiving frequency fRX of the receiving circuit 10, that is, the broadcasting station preset in the tuning key Pm is selected.

Figure 7A:
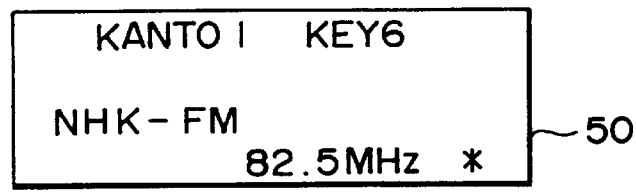
FIGS. 7A to 7D are views for showing one preferred embodiment of the displayed content.

Subsequently, the processing is advanced to the step 133, and at the step 133, the data KYOKU of a name of the broadcasting station written in the area Am corresponding to the tuning key Pm in the data areas A1 to A7 in the memory 34 is read out and the read-out data KYOKU is converted into the displaying data in reference to data in the ROM 41, supplied to the controller 42, and for example, as shown in FIG. 7A, the name of the broadcasting station is displayed at the LCD 50.

In addition, at this time, the frequency data FREQ read out at the step 132 is similarly converted into the display data and supplied to the controller 42 and the receiving frequency fRX at this time is displayed in digital form at the LCD 50.

Subsequently, the processing is advanced to the step 134 and at the step 134, the data table DTBL is referenced with the frequency data FREQ and the data KYOKU of the name of broadcasting station used for displaying in FIG. 7A, for example, thereby it is checked if the satellite station is prepared for the broadcasting station receiving signal at present and when the satellite station is prepared, a mark "*" indicating a presence of the satellite station is displayed after the number indicating the frequency as shown in FIG. 7A, for example.

After this operation, the processing is returned back to the step 104, and the key input waiting state is applied again.

Accordingly, as the tuning key Pm is depressed, it is possible to select the broadcasting station pre-set in the tuning key Pm. In addition, either the name of the broadcasting station or the frequency is displayed at the LCD 50. Further, if the satellite station is prepared in the broadcasting station receiving a signal, this is displayed with the mark "*".

[Pre-set of the Satellite Station]

As already described in the aforesaid item of [Pre-set of the Broadcasting Station], a master station is pre-set in the areas A1 to A7 in the memory 34 and even if the satellite station is present, the satellite station is not pre-set. Then, the master station sometimes shows a poor received state in a certain receiving location. In such a case as above, the pre-set processing of the satellite station in place of the master station corresponds to this [Pre-set of the Satellite Station].

In the case that this processing is carried out, the master station is at first selected in accordance with the item of [Tuning of the Pre-set Broadcasting Station]. At this time, if the satellite station is prepared for the master station, a mark "*" indicating a presence of the satellite station is displayed after a number indicating a frequency as described above (as indicated in FIG. 7A).

After this operation, when the key input waiting state occurs at the step 104, the tuning key Pm when the master station is selected is continued to be depressed for more than 2 seconds, for example. Then, although the processing at the CPU 31 is advanced from the step 104 to the step 131 through the steps 111 and 112, in this case, since the tuning key Pm is continued to be depressed for more than 2 seconds, the processing is advanced from the step 131 to the step 141.

Then, at the step 141, the satellite flag SFLG is set to "1" and at the step 142, a list of the frequencies of the satellite stations for the master station being selected at present is displayed at the LCD 50. In this list of the frequencies, a frequency data FREQ in the column of the broadcasting station receiving signal at present in the frequency data FREQ in the data table DBTL is applied and displayed.

For example, if the broadcasting station (a master station) being received at present is "NHK-FM" in "Kanto 1" in the data table DTBL, the frequency data FREQ prepared in the data table DTBL in respect to this "NHK-FM" has frequencies of "82.5", "80.7" . . . "85.1", so that these frequencies re displayed as shown in FIG. 7B.

Figure 7B:
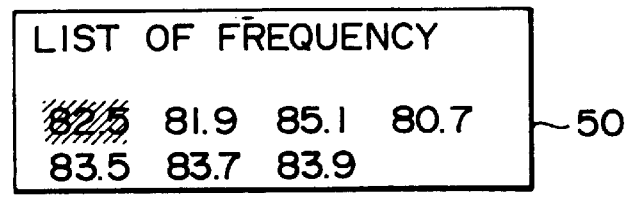

At this time, the number "82.5" indicating a first frequency is inverse displayed meaning a cursor (in FIG. 7B, the inverse display is indicated by a slant line for a sake of drawing and this is similarly applied to the following description).

Then, the processing is returned back from the step 142 to the step 104, the key input waiting is attained. In view of the foregoing, as either the down key KD or the up key KU is depressed, although the processing is advanced from the step 104 to the step 111, at present, a relation of SFLG="1" is attained at the step 141, resulting in that the processing is advanced from the step 111 to the step 151. At this step 151, it is discriminated if the key depressed at the step 104 is the up key KU or the down key KD and at present, since the key is either the key KD or KEU, so that the processing is advanced from the step 151 to the step 152.

At this step 152, when the key depressed at the step 104 is the down key KD, a cursor (an inverting display) displayed at the LCD 50 is moved from a position of number indicating the frequency up to now a next position of number indicating a next frequency and when the key depressed at the step 104 is the down key KD, the display is controlled in such a way that the cursor is moved from the position of the number indicating the frequency up to now to the next position of the number indicating a previous frequency.

Then, at the step 152, as the displaying position of the cursor is moved by a distance corresponding to one kind of frequency, the processing is returned back from the step 152 to the step 104 and the key input waiting state is attained. Accordingly, either the down key KD or the up key KU is depressed to enable the cursor to be positioned at an optional number of the numbers of frequencies for the satellite station displayed at the LCD 50.

Figure 7C:
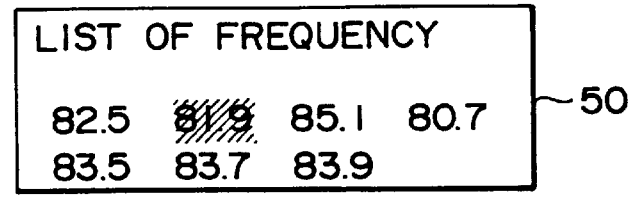

In view of the foregoing, as the determination key KE is depressed when the cursor is positioned at a frequency number of an optional satellite station (or a master station), "81.9" of the frequency number as shown in FIG. 7C, for example, the processing is advanced from the step 104 through the step 111 and through the step 151 to the step 161 and at the step 161, it is discriminated if the key depressed at the step 104 is the determination key KE and in this case, this is the determination key KE, the processing is advanced from the step 161 to the step 162.

Then, at the step 162, the satellite flag SFLG becomes "0" and at the next step 163, the frequency data FREQ at a position where the cursor is displayed, of frequency numbers of the satellite stations displayed at the LCD 50 is taken out of the data table DTBL and the taken-out frequency data FREQ is written into the data area Am corresponding to the key Pm (a tuning key Km which becomes a trigger of execution subsequent to the step 131) which is continued to be depressed for more than 2 seconds in data areas A1 to A7 of the memory 34.

Then, at the step 164, the frequency data FREQ written into the data area Am in the memory 34 at the step 163, i.e. the frequency data FREQ at a position displayed by the cursor is converted into a frequency dividing ratio N and this frequency dividing ratio N is set in the variable frequency dividing circuit 22.

Accordingly, the receiving frequency fRX of the receiving circuit 10 becomes from this time a frequency of number where the cursor is positioned when the determination key KE is depressed. For example, when the determination key KE is depressed from the state shown in FIG. 7C, the receiving frequency fRX is set to the frequency of 81.9 MHz due to the fact that the cursor is positioned at the number "81.9".

Figure 7D:
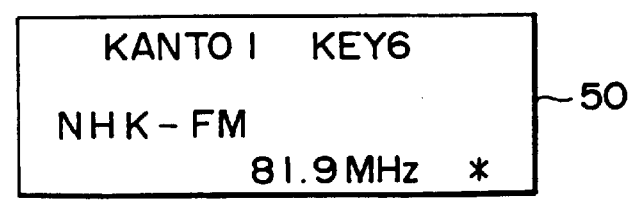

Subsequently, the processing is advanced to the step 165 and as shown in FIG. 7D, for example, the display of the received frequency at the LCD 50 is changed to a displayed frequency tuned at the step 164 and after this operation, the processing is returned back to the step 104 and the key input waiting state is attained.

In this case, when the key input waiting state is attained, a relation of SFLG="0" is already set at the step 162, so that even if the keys KD, KU or KE are depressed, the processing is not advanced to the step 151 and then the processing [such as tuning of the pre-set broadcasting station] is carried out by the steps subsequent to the step 112.

Accordingly, when the master station is selected [by the tuning of the pre-set broadcasting station] and the satellite station to be target is selected, the satellite station can be pre-set in place of the master station. Then, the satellite station pre-set in this way can be selected by the tuning key Pm in the same manner as that for the master station [at the tuning of the pre-set broadcasting station].

[Conclusion]

As described above, in accordance with the aforesaid receiver, the broadcasting station can be pre-set to the tuning keys P1 to P7 through an area call and in the case that the receiving state of the pre-set master station is poor, the pre-set master station can be replaced with the satellite station. Accordingly, it is possible to perform a receiving operation at the best state for every and all broadcasting programs. Further, at this time, it is not necessary to perform a manual tuning operation.

In addition, since the master station showing a bad receiving state is replaced with the satellite station, the number of tuning keys P1 to P7 is not increased and it is possible to pre-set only the broadcasting station capable of receiving the tuning keys P1 to P7 in a superior manner.

Further, as shown in FIGS. 7A–7D, for example, a list of the frequencies of the satellite station is displayed and the station is selected from it, its selection may easily be carried out. In addition, the keys KD, KU, KE and LCD 50 used for selecting and determining of the satellite station are originally arranged for receiving the character multiplex broadcasting, so that it is not necessary to arrange a new key for selecting and determining the satellite station.

[Others]

In the forgoing description, it is satisfactory that the data in the last channel may be held in the memory 34 at the steps 132 and 164, respectively. In addition, selection or area at the step 120 and tuning of station at the step 132 or the like can be performed by a rotary encoder.

Further, the frequency data FREQ in the data table DTBL and the memory 34 can also have a frequency dividing ratio N in the variable frequency dividing circuit 22. In addition, in the foregoing description, the present invention is applied to the case that the receiver circuit 10 receives an FM broadcasting program and a similar configuration may also be attained for the case in which either an AM broadcasting or a television broadcasting is received.

In accordance with the present invention, since the master station pre-set to the tuning key can be replaced with the satellite station, every and all broadcasting programs can be received under the most-suitable state.

Further, at that time, it is not necessary to perform a manual tuning operation and correspondingly it is not necessary to arrange many tuning keys. Further, when the satellite station is pre-set, the station is selected from the list and pre-set, resulting in that the pre-setting operation may easily be carried out.

What is claimed is:

1. A synthesizer receiver in which a signal formed in a PLL is used to change a frequency of a received signal, and a frequency dividing ratio of a variable frequency dividing circuit of said PLL is changed to modify a frequency of said signal and to change a received frequency, the synthesizer receiver comprising:

a plurality of tuning keys;

a memory having a plurality of data areas corresponding to each of said plurality of tuning keys;

a data table having master station data corresponding to a plurality of master frequencies associated with a plurality of broadcasting stations which are received at each of a plurality of divided geographical areas obtained by dividing a geographical area used by the receiver, and having satellite data corresponding to one or more satellite station frequencies individually associated with each one of said plurality of broadcasting stations in the divided geographical areas when a master station has at least one associated satellite station, wherein when one of said plurality of divided geographical areas is specified, said data corresponding to all of said plurality of master frequencies which are received in the specified divided geographical area is written respectively into said plurality of data areas in said memory, when one of said plurality of data areas in said memory is specified and a timing key operation for changing frequency data is performed, said satellite data corresponding to said satellite frequencies individually associated with said master stations is read out of said data table and written into said specified data area, and when one of said plurality of tuning keys is operated, frequency data written into a particular data area of said memory corresponding to one of said master stations or corresponding to one of said satellite stations is read out of said particular data area corresponding to said operated tuning key; and control means for changing said frequency dividing ratio of said variable frequency dividing circuit in response to said read out frequency data.

2. The synthesizer receiver according to claim 1, further comprising a display element for displaying a frequency of the master station associated with a broadcasting station corresponding to frequency data written into a data area and for displaying a frequency of each satellite station associated with said master station being displayed when one of said plurality of data areas in said memory is specified by a key operation.

3. The synthesizer receiver according to claim 2, further comprising a decoder circuit for a character multiplex broadcasting, wherein a character program by said character multiplex broadcasting is displayed at said display element corresponding to character data taken out of said decoder-circuit.

* * * * *